United States Patent [19]

Lackey et al.

[11] 4,197,471
[45] Apr. 8, 1980

[54] CIRCUIT FOR INTERFACING BETWEEN AN EXTERNAL SIGNAL AND CONTROL APPARATUS

[75] Inventors: Robert P. Lackey, North Attleboro; Gim P. Hom, Sharon; Daniel W. Juska, Millville, all of Mass.

[73] Assignee: Texas Instruments Incorporated, Dallas, Tex.

[21] Appl. No.: 837,968

[22] Filed: Sep. 29, 1977

[51] Int. Cl.² .......................... H03K 3/42; H03J 39/12
[52] U.S. Cl. .............................. 307/311; 307/DIG. 1; 307/237; 250/211 J
[58] Field of Search ................. 307/311, 237, DIG. 1; 250/551, 352, 211 J; 364/120

[56] References Cited

U.S. PATENT DOCUMENTS

| | | | |
|---|---|---|---|
| 3,691,403 | 9/1972 | Newmeyer | 307/311 |
| 4,041,331 | 8/1977 | Westermall et al. | 307/311 |
| 4,079,272 | 3/1978 | Howatt | 307/DIG. 1 |

Primary Examiner—Stanley D. Miller, Jr.
Assistant Examiner—B. P. Harris
Attorney, Agent, or Firm—John A. Haug; James P. McAndrews

[57] ABSTRACT

An input/output interface for a digital controller including an optical isolator coupling an input portion which formats an external signal to make it compatible with the optical isolator and an output portion comprising an RC network connected to a threshold detector with hysteresis to provide a filtered output logic signal in addition to an accompanying audio or visual signal. The interface, with slight modifications can be used with either DC or AC external signals.

9 Claims, 2 Drawing Figures

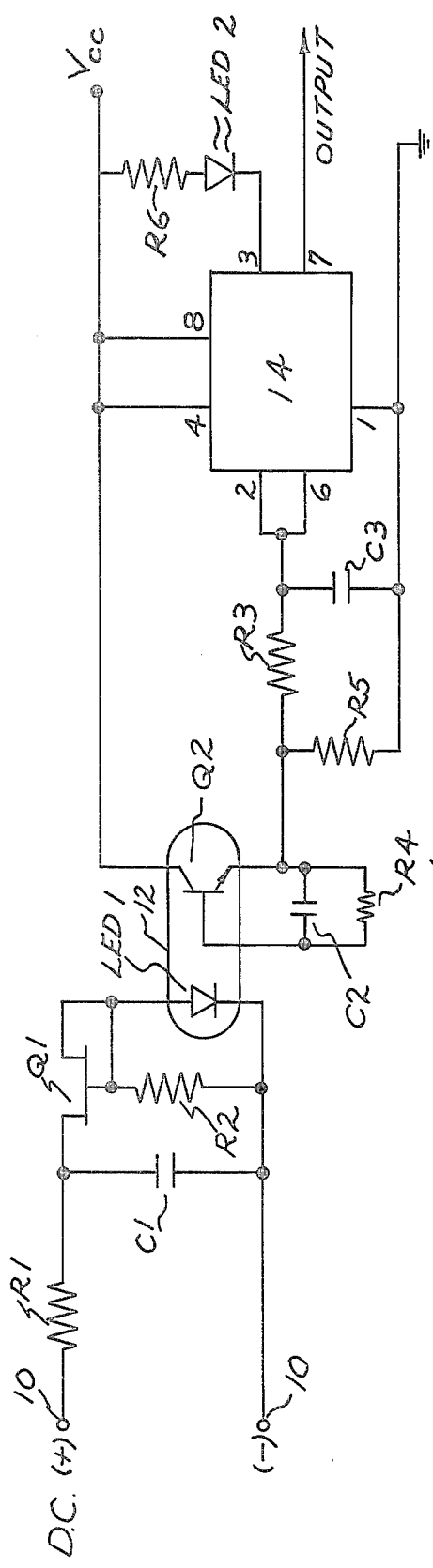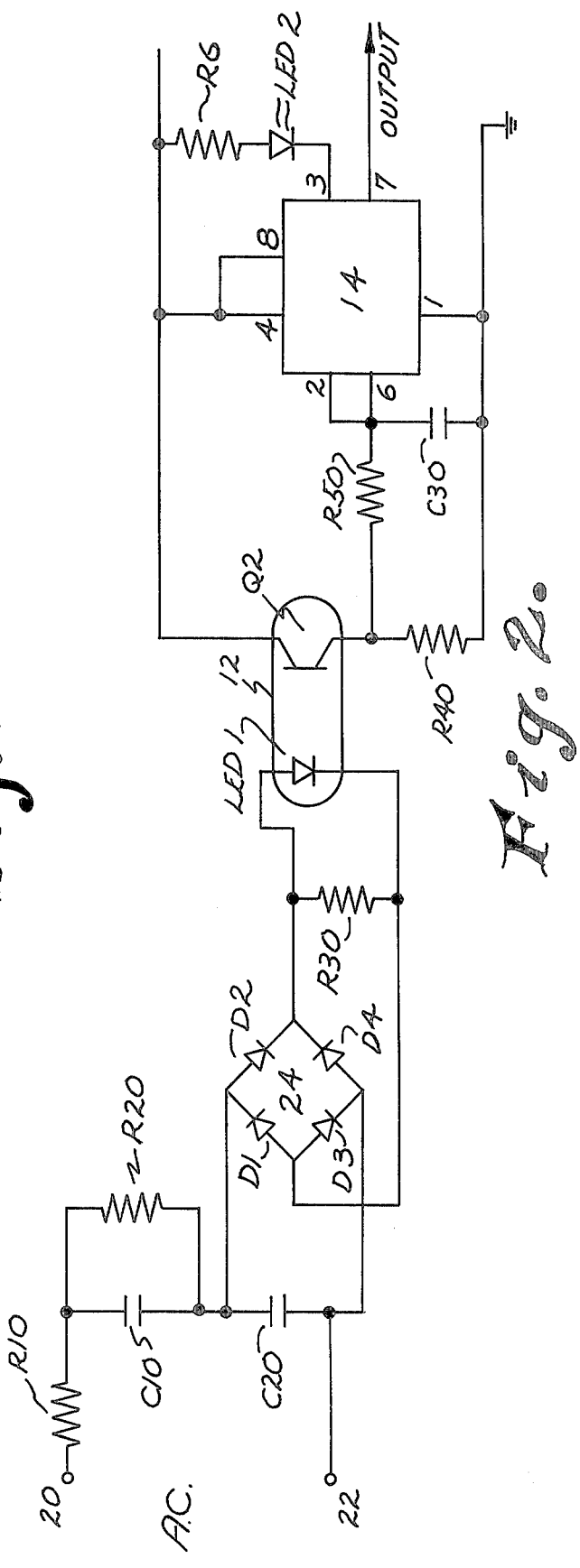

CIRCUIT FOR INTERFACING BETWEEN AN EXTERNAL SIGNAL AND CONTROL APPARATUS

This invention relates to digital computer I/O interface systems, and more particularly to optically coupled digital computer I/O interface systems.

In computerized control systems it is frequently desirable to interface a relatively high level AC or DC voltage to a much lower level logic input to a digital computer or other digital device. A known dependable and reliable technique involves optical coupling to provide electrical isolation in I/O interface systems. Typically such a system employs a light emitting diode optically coupled to a photo transistor. On the input side of the interface a current source is included to provide current of a level suitable for the light emitting diode (LED) along with filtering means to eliminate line transients which might otherwise be transmitted to the computer. The output side of the interface includes means to make the signal compatible with TTL logic including a voltage comparator means, feedback and reference resistors, an output switch and visual indicating means. While this interface is in most instances reliable it is relatively costly. It is an object of the invention to provide an improved I/O interface which is compatible with TTL logic. Another object is the provision of an interface to convert a users typical 110 volt AC or 24 v DC to digital logic level signals. Yet another object is the provision of such an interface system which is significantly less expensive than prior art systems and to improve upon the reliability of such prior art systems.

Briefly, in accordance with the invention, the input or high voltage side of the interface is provided with a current source, a high frequency filter and a light emitting diode (LED) connected in such a way to make it less current sensitive. A photo transistor is optically coupled to the LED with its emitter connected to an RC timing circuit to provide a desired time interval which in turn is connected to a threshold detector circuit with hysteresis and having dual outputs. The first output is connected to a digital control system while the second output is connected to means to indicate the status of the interface, such as an LED device.

The interface system is adaptable for interfacing AC or DC machines to a computer. By way of example, when a machine is turned on, the line voltage supplies current to the light emitting diode such that the logic signal representation is supplied to the optically coupled photo transistor which after a predetermined time delay tells the computer that the machine is on. The logic signal will be in the opposite condition when the machine is off.

The present invention, as well as further objects and advantages thereof, may be more fully understood from the following description of preferred embodiments in conjunction with the drawings, in which:

FIG. 1 is a schematic diagram of a preferred interface system for DC voltage; and FIG. 2 is a schematic diagram of a preferred interface system for AC voltage.

Referring now to the drawings, FIG. 1 illustrates a preferred embodiment of an input system for DC voltage embodying this invention. The embodiment of FIG. 1 is particularly adaptable to interface an on/off switched 3-28 volt DC signal (input terminal 10) to the input of the computer. The existence of the DC signal may indicate that an externally connected device is currently turned on, whereas the non existance of the signal may indicate that the device is turned off.

The positive input terminal is connected to a high frequency noise filter R1,C1 which in turn is connected to field effect transistor (FET) Q1 used as a current source. The use of the FET permits the interface to be used with a wide range of line voltages, e.g. 3-28 volts. It will be appreciated that if a smaller range were desired, for example 15-28 volts, transistor Q1 could be replaced with a resistor. Thus transistor Q1 which is connected to a light emitting diode LED 1 of optical coupler 12, provides a current source of approximately five milliamperes regardless of the voltage on it so that a known current passes through diode LED 1. A resistor R2 is connected across diode LED 1 in order to reduce its current sensitivity and in effect make the optical coupler 12-resistor R2 combination a voltage responsive device. Since optical couplers typically have gains that vary widely this results in a more stable and predictable arrangement with more repeatability from unit to unit.

Current through diode LED 1 causes the diode to radiate and this radiation is received at the base terminal of photo transistor Q2, which is selectively positioned to be optically coupled to LED 1. The collector of transistor Q2 is connected to a voltage supply, $V_{cc}$ while the emitter is coupled to an RC network comprising R3,C3. A relatively small resistor R5 is connected across R3,C3. The RC network is connected to a switching circuit 14 having TTL compatible output. A suitable circuit is SN52555, SN72555 an integrated monolithic timing circuit available from Texas Instruments Incorporated. However, circuit 14 is not used as a timing circuit but rather as a reference operational amplifier hysteresis output switch.

The output of the RC circuit R3,C3 is connected to pins 2 and 6 of circuit 14, the trigger and the threshold respectively. Pins 4 and 8 of circuit 14 reset and $V_{cc}$ respectively, are connected to supply voltage $V_{cc}$. Pin 1, ground, is connected to ground while pin 7, discharge, is connectable to the digital computer and pin 3, output, is connected to a light emitting diode LED 2 and serially connected resistor R6.

Circuit 14 has dual thresholds. When the upper threshold is crossed, LED 2 and the output turn on (go low). When the lower threshold is cross, diode LED 2 and the output turn off (go high). Circuit 14 used with the external timing means of R3,R5,C3 combination provides a turn on delay and a turn off delay. The timing means is chosen to provide as long a delay as possible without impacting on the throughput cycle time of the digital controller. By way of example the interface systems of this invention are particularly adaptable for interconnection with a digital programmable logic controller as shown and described in U.S. Pat. Nos. 3,953,834; 3,938,104; 3,982,230 and 3,924,242. Typically such controllers complete their memory scan every eight milliseconds so the output time of the controller itself from input to output is sixteen milliseconds. The RC network comprising R3,C3,R5 combination is chosen to give a two millisecond delay to filter out low frequency noise. The resistance value of resistor R5 is much less than resistor R3 so that the time constant for charging capacitor C3 through resistor R3 is nearly the same as that of discharging through resistors R3,R5.

Resistor R4 is connected across the base of transistor Q2 and its emitter to prevent self turn on of the optical coupler due to leakage at high temperatures. Capacitor C2 is connected in parallel with resistor R4 to reduce the susceptibility of high frequency noise.

Thus when a machine switch is closed so that a positive voltage in the range of 3 to 28 volts is present at the positive input terminal 10 it is filtered by the combination of resistor R1 and capacitor C2 to eliminate the effects of high frequency transients. Regardless of the specific value of voltage a predetermined current of approximately five milliamperes is produced by transistor Q1 which flows through diode LED 1 with a portion being shunted through resistor R2. Diode LED 1 emits radiation which saturates the photo transistor Q2. The optical coupler 12 turns on at approximately 1.1 volts. Once transistor Q2 turns on capacitor C3 begins to charge toward supply voltage $V_{cc}$ with a time constant of approximately 2 milliseconds. When the voltage across capacitor C3 exceeds approximately two thirds of supply voltage $V_{cc}$ pins 3 and 7 of circuit 14 pull low and the interface is on with diode LED 2 lit.

When the machine switch is opened transistor Q2 turns off and discharges C3 through resistors R3 and R5. When the voltage on capacitor C3 drops lower than approximately one third of supply voltage $V_{cc}$ pins 3 and 7 go high. Since pin 7 is an open collector transistor this will be up to the supply voltage $V_{cc}$ of 5-10 volts.

An interface system for DC input voltage made in accordance with the invention employed the following circuit components:

| | |
|---|---|
| R1 resistor | 180Ω |
| R2 resistor | 1.8KΩ |
| R3 resistor | 330KΩ |
| R4 resistor | 10MΩ |
| R5 resistor | 68KΩ |
| R6 resistor | 680Ω |
| C1 capacitor | .1μf |
| C2 capacitor | .001μf |
| C3 capacitor | 3900pf |
| 12 optical coupler | TIL 111 |
| 14 integrated circuit | SN72555 |
| Q FET transistor | 2N 5952 |
| LED 2 light emitting diode | TIL 209A |

Turning now to FIG. 2 an interface system is shown which is useful with AC line voltage. The AC line is connected through a switch (not shown) to the input terminals 20,22. Terminal 20 is connected to a high frequency noise filter comprising resistor R10 and capacitor C20. Interconnected between resistor R10 and capacitor C20 is another capacitor C10 which is used to decrease the voltage level down to bridge 24 comprising a full wave diode bridge 24 and the optical coupling device 12. A full wave bridge is used to optimize the response time. That is, even though three diodes could be eliminated if half wave rectification were used, if the machine switch were turned on right after a peak a full eight milliseconds would pass before the signal could initiate any response.

Resistor R30 is connected across the light emitting diode LED 1 of the optical coupler 12 to effectively make it responsive to voltage, e.g. 1.1 volts as in the FIG. 1 embodiment. Resistor R20 is connected across capacitor C10 to discharge the capacitor in the event that the machine switch is opened at the peak of the input sine wave.

The output or logic side of the interface is the same as in the FIG. 1 embodiment except for the external timing means. A longer time constant is required in the AC interface so that eight millisecond ripples can be filtered out, therefore a time constant of approximately 10 milliseconds is chosen as opposed to the 2 millisecond time constant of FIG. 1.

When the machine switch is closed, current flows through the filter comprising resistor R10 capacitor C20, is rectified by diode bridge 24 and flows through resistor R30 and light emitting diode LED 1. Resistor R10 and capacitor C20 reduce susceptibility of high frequency noise. Voltage is dropped across resistor R30 forward biasing the light emitting diode LED 1. Current flows through diode LED 1 saturating the photo transistor Q2. When transistor Q2 turns on, capacitor C30 begins to charge with a time constant of approximately 2 milliseconds. As in the FIG. 1 embodiment, when the voltage across the capacitor exceeds approximately two thirds the supply voltage $V_{cc}$ pins 3 and 7 pull low and the interface is on with light emitting diode LED 2 lit.

When the machine switch is opened transistor Q2 turns off and discharges C30 through resistors R40 and R50 with a discharge time constant of approximately 10 milliseconds. When voltage on the capacitor drops below approximately one third of supply voltage $V_{cc}$ pins 3 and 7 go high and the interface is off with light emitting diode unlit.

An interface system for AC input voltage made in accordance with the invention employed the following circuit components:

| | |
|---|---|
| R10 resistor | 1KΩ |
| R20 resistor | 100KΩ |
| R30 resistor | 100Ω |
| R40 resistor | 75KΩ |
| R50 resistor | 33KΩ |
| R6 resistor | 680Ω |
| C10 capacitor | .47μf |
| C20 capacitor | .1μf |
| C30 capacitor | .1μf |
| D1-D4 diodes | IN4148 |
| 12 optical coupler | TI 111 |
| 14 integrated circuit | SN72555 |
| LED 2 light emitting diode | 209A |

Among the advantages that the above described interface offers compared to prior art systems can be noted the following. Prior art circuits required the use of a voltage comparator and a minimum of four external resistors and an additional transistor to achieve the same function as that obtained by the use of the single circuit 14. Since fewer components are used the interface made in accordance with the invention is inherently more reliable. Additionally, the prior art circuits are more expensive since the SN52555 and SN72555 cost roughly the same as the operational amplifier by itself. Additionally reliability is improved due to the double output of circuit 14. If a light emitting diode used as status indicating means failed due to vibration, high temperature, over stressing or the like and it opened, then the interface had to be replaced since it was connected to the output of the operational amplifier. In the present interface systems failure of the diode LED 2 will not affect the output at pin 7. Another significant saving over prior art systems resulted from moving the low frequency noise filtering to the logic side of the interface. For instance, when located in the high voltage side in one prior art circuit a capacitor of 3.3 μf was required as compared to the 390pf capacitor C3 of FIG. 1 and 0.1

μf capacitor C30 of FIG. 2. Smaller capacitors are not only less expensive they also provide more stable timing. Further, locating the timing means on the output side of the system provides improved stability since it is not affected by the input voltage.

Having described the invention in connection with certain specific embodiments thereof it is to be understood that further modifications may now suggest themselves to those skilled in the art and it is intended to cover such modifications as fall within the scope of the appended claims.

We claim:

1. A circuit for interfacing a digital computer with an external machine, comprising:

an input circuit portion, including current source means to produce a current upon receiving an electrical signal indicative of the status of the external machine;

high frequency filter means coupled to the input side of the current source;

radiation emissive semiconductor means connected to the output of the current source means responsive to the electrical signal to emit radiation according to the status of the external machine;

and resistor means connected across the radiation emissive semiconductor means to reduce the current sensitivity of the semiconductor means;

an output circuit portion including a phototransistor optically coupled to the radiation emissive semiconductor means and adapted to conduct current when the radiation emissive semiconductor means emits radiation;

timing means coupled to the output of the phototransistor;

threshold detector circuit means with hysteresis having an input and an output, the input of the detector circuit means connected to the output of the timing means, the detector circuit means adapted to produce with generally equal on and off delays a logic signal having a logic condition indicative of the status of the external machine.

2. A circuit according to claim 1 in which the detector circuit means has another output, and electrically responsive indicating means, the indicating means being connected to the latter mentioned output.

3. A circuit according to claim 2 in which the electrically responsive indicating means is a light emitting diode.

4. A circuit for interfacing a digital computer with an external machine, comprising:

an input circuit portion, an output circuit portion and an optical coupler coupling the input and the output circuit portions;

the input circuit portion including current source means to produce a current upon receiving an electrical signal indicative of the status of the external machine;

high frequency filter means coupled to the input side of the current source;

rectifier means connected to the input circuit portion intermediate the filter means and the current source; the optical coupler including radiation emissive semiconductor means connected to the output of the current source means;

and resistor means connected across the radiation emissive semiconductor means to reduce the current sensitivity of the semiconductor means;

timing means coupled to the output of the optical coupler;

threshold detector circuit means with hysteresis having an input and an output, the input of the detector circuit means connected to the output of the timing means, the detector circuit means adapted to produce a logic signal having a logic condition indicative of the status of the external machine.

5. A circuit according to claim 4 in which the detector circuit means has another output, and electrically responsive indicating means, the indicating means being connected to the latter mentioned output.

6. A circuit according to claim 1 in which the current source means is a field effect transistor.

7. A circuit according to claim 4 in which the detector circuit means has a TTL compatible output.

8. A circuit according to claim 1 in which the threshold detector circuit means is a monolithic precision timer circuit.

9. A circuit according to claim 4 in which the threshold detector circuit means is a monolithic precision timer circuit.

* * * * *